(12) United States Patent
Mohr

(10) Patent No.: US 6,184,725 B1
(45) Date of Patent: *Feb. 6, 2001

(54) CIRCUIT ARRANGEMENT FOR ISOLATED VOLTAGE AND/OR CURRENT MEASUREMENT

(75) Inventor: Werner Mohr, Weinstadt (DE)

(73) Assignee: Alcatel, Paris (FR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/977,782

(22) Filed: Nov. 25, 1997

(30) Foreign Application Priority Data

Nov. 28, 1996 (DE) .............................. 196 49 304

(51) Int. Cl.$^7$ ..................................................... H02M 5/45
(52) U.S. Cl. ........................... 327/91; 327/362; 327/369; 327/514; 363/21
(58) Field of Search ..................... 327/530, 509, 327/514, 362, 369, 190, 91; 363/97, 21, 131

(56) References Cited

U.S. PATENT DOCUMENTS

| 3,916,310 | 10/1975 | Stark et al. | 324/127 |
|---|---|---|---|
| 5,349,523 | * 9/1994 | Inoue et al. | 363/97 |
| 5,499,184 | * 3/1996 | Sqibb | 363/100 |

FOREIGN PATENT DOCUMENTS

| 676393 | 1/1991 | (CH) . |
|---|---|---|
| 243353 | 2/1987 | (DD) . |
| 3435267 | 4/1986 | (DE) . |
| 243353 | 2/1987 | (DE) . |
| 4128284 | 3/1993 | (DE) . |
| 0246401 | 2/1987 | (EP) . |
| 0246401 | 11/1987 | (EP) . |
| 0398456 | 11/1990 | (EP) . |
| 0686850 | 12/1995 | (EP) . |
| 07110347 | 4/1995 | (JP) . |

OTHER PUBLICATIONS

"High–Linearity Analog Optocouplers" Technical Data, prospectus of Hewlett Packard, pp. 1 to 16, 1993.

* cited by examiner

Primary Examiner—Dinh T. Le
(74) Attorney, Agent, or Firm—Ware, Fressola, Van Der Sluys & Adolphson LLP

(57) ABSTRACT

A circuit arrangement for making isolated voltage and/or current measurements on a transmission line is characterized in that a shunt branch between the go conductor (+) and the return conductor (−) contains a series combination of a transformer (T), a first optically controllable, clocked switching element (OS1), and a first resistor (R1), and/or that the go conductor (+) or the return conductor (−) contains a second resistor (R2) shunted by a series combination of a transformer (T) and a second optically controllable, clocked switching element (OS2). The measured voltage and current values can thus be taken off linearly to the voltages and currents of the transmission lines using simple means and only few active components, particularly without analog-to-digital converters and power supplies tied to the potential of the transmission line.

7 Claims, 3 Drawing Sheets

US 6,184,725 B1

CIRCUIT ARRANGEMENT FOR ISOLATED VOLTAGE AND/OR CURRENT MEASUREMENT

TECHNICAL FIELD

This invention relates to a circuit arrangement for making isolated voltage and/or current measurements on a transmission line with a go conductor and a return conductor for supplying power to electrical apparatus.

BACKGROUND OF THE INVENTION

Circuit arrangements for the isolated sensing of binary electric signals of different pulse heights at a transmission line are known, for example, from EP 0 398 456 B1 or from a prospectus of Hewlett Packard entitled "High-Linearity Analog Optocouplers", 1993, pages 1 to 16.

In networks with central powering, both the supply voltage and the supply current can generally be measured at the terminal station. This was done formerly using simple analog pointer-type instruments which were tied to the supply potential.

Since the introduction of operator terminals, however, it must be possible to process the two measured values digitally. This involves difficulties with electrical isolation, because the potentials of the voltages on the transmission lines may be up to 2 kV above ground potential, with voltage and current values occurring between the go conductor and the return conductor in the ranges of 0 V to approximately 300 V and 0 A to approximately 70 mA, respectively.

One possibility of making an isolated measurement is to use an analog-to-digital converter (ADC) which is tied to the potential of the transmission line and whose output can be taken at a potential near ground potential with the aid of an optocoupler interface. This, however, requires a separate power supply which is tied to the potential of the transmission line. The supply current from the transmission line cannot be used because in the event of an interruption no current flows there and only a very small current may be consumed in a path parallel to the line. Another problem is that any fairly linear, temperature-independent measurement using optocouplers can only be implemented with complex compensation circuits. In addition, if active components, such as transistors, which necessarily form part of an ADC circuit, are used at an elevated potential, the so-called latch-up problem arises, which, if the supply voltages rise above or fall below the rated values even by small amounts, may result in thermal destruction of the components.

CH 676 393 A5 discloses a circuit arrangement for converting an analog measurement voltage into an isolated digital signal in which the measured voltage is coupled out near ground potential via an optoelectronic coupling element consisting of a light-emitting diode (LED) and a phototransistor tied to the potential of the transmission line. The voltage measurement itself is made by means of a capacitor and a circuit which controls the charging and discharge of the capacitor. Such a capacitor, however, is necessarily quite voluminous. In addition, its discharge curve follows an exponential function, which impairs the accuracy of the measurement.

The above-cited EP 0 398 456 B1 discloses a circuit arrangement for the isolated sensing of binary electric signals of different pulse heights which includes an optocoupler that is connected in series with an electronic circuit module to the go and return conductors of the circuit arrangement. This circuit arrangement can be operated without clock pulses but has the disadvantage of being unsuitable for measuring analog signals because of the optocoupler's high degree of nonlinearity. It also requires a high-potential constant-current source for the optocoupler, which causes the above-mentioned latch-up problem.

The above-cited prospectus of Hewlett Packard also describes circuit arrangements with pairs of optocouplers in which the analog measured values are obtained near ground potential by comparing the two signals provided by the two optocouplers, since the individual optocouplers themselves deliver only analog signals. This, however, presents new problems because of the different aging rates of the two optocouplers.

SUMMARY OF THE INVENTION

The object of the invention is to improve a circuit arrangement of the above kind by the simplest possible means in such a way that as few active components as possible, particularly no analog-to-digital converters and no power supplies, are necessary at the potential of the transmission line, and that the measured voltage and current values are related to voltages and currents on the transmission line as linearly as possible.

According to the invention, this object is attained with respect to the voltage measurement by connecting a series combination of a transformer, a first optically controllable, clocked switching element, and a first resistor into a shunt branch between the go conductor and the return conductor.

With respect to the current measurement, the object of the invention is attained by connecting a second resistor into the go conductor or the return conductor and shunting the second resistor by a series combination of a transformer and a second optically controllable, clocked switching element.

The circuit arrangements according to the invention solve the above problems by "chopping" the voltages by means of the respective optically controllable, clocked switching elements. The clock frequency from a grounded clock generator which is optically coupled to the high-voltage side will, as a rule, be of the order of 1 kHz. In the secondary of the transformer, an alternating voltage proportional to the respective measurement signal is thus induced which can be taken as an isolated voltage, for example at ground potential. It is only necessary to provide suitable isolation between the primary and secondary of the transformer.

An analog-to-digital converter is not required in the circuit arrangements according to the invention. A power supply tied to the potential of the transmission line is not necessary, either. Thus, by minimizing the active components on the high-voltage side, the danger of latch-up, among other things, is significantly reduced. Finally, the voltage measurement is possible with a smaller load than in the prior art, because a simple resistor is used instead of a network.

In a preferred embodiment of the circuit arrangement according to the invention, an isolated voltage measurement and an isolated current measurement can be performed simultaneously.

In a preferred embodiment of this combined circuit arrangement, the same transformer is provided for the voltage measurement and for the current measurement. In this manner, the need for one of the two expensive high-voltage-isolated transformers is eliminated.

To be able to take off a DC signal for the desired measured quantities, in a further embodiment of the invention, a rectifier device is provided at the secondary of the transformer.

In a development of this embodiment, the rectifier device comprises at least one diode, in the simplest case a diode connected between the two secondary outputs of the transformer.

In a preferred development of the above embodiments, a constant-current source is provided at the primary of the transformer for linearizing the characteristic of the rectifier circuit.

In this manner, a greater dynamic range can be opened for the measurement. While in the prior art, voltages between the go conductor and the return conductor could only be taken off in the range between 50 V and 350 V, with the use of a constant-current source at the primary of the transformer, the voltage values taken from the secondary may vary between 20 V and 350 V.

In a particularly preferred embodiment of the combined circuit arrangement according to the invention for making isolated voltage and current measurements, instead of the second optically controllable, clocked switching element connected in parallel with the second resistor, a switch is provided which can connect the end of the first optically controllable, clocked switching element remote from the transformer to the end of the first resistor facing the transformer in a first switch position or to the end of the second resistor remote from the transformer in a second switch position. This eliminates the need for one of the two optically controllable, clocked switching elements.

In an advantageous development of this embodiment, in a third switch position, the switch disconnects the end of the first optically controllable, clocked switching element remote from the transformer both from the end of the first resistor facing the transformer and from the end of the second resistor remote from the transformer. Thus, if no voltage or current measurement is to be performed, the switch can put the circuit in a quiescent state in which no connection exists between the go conductor and the return conductor, so that no leakage current can flow.

In preferred embodiments, the optically controllable, clocked switching elements of the circuit arrangement according to the invention are implemented with photoMOS relays, particularly with optoelectronically driven MOSFETS. The latter components contain a light-emitting diode (LED) which is driven by a grounded clock generator at a frequency around 1 kHz and clocks an MOS transistor at a high potential via a built-in photocell.

Further advantages of the invention will become apparent from the following description and the accompanying drawings. According to the invention, the above-mentioned features and the features set forth below may be used singly or in arbitrary combinations. The embodiments are not intended to be limited to the details shown, but the description is made only by way of example.

BRIEF DESCRIPTION OF THE DRAWINGS

The invention is illustrated in the drawings and will be explained in more detail with the aid of embodiments. In the drawings.

BEST MODE CARRYING OUT THE INVENTION

Figure 1:
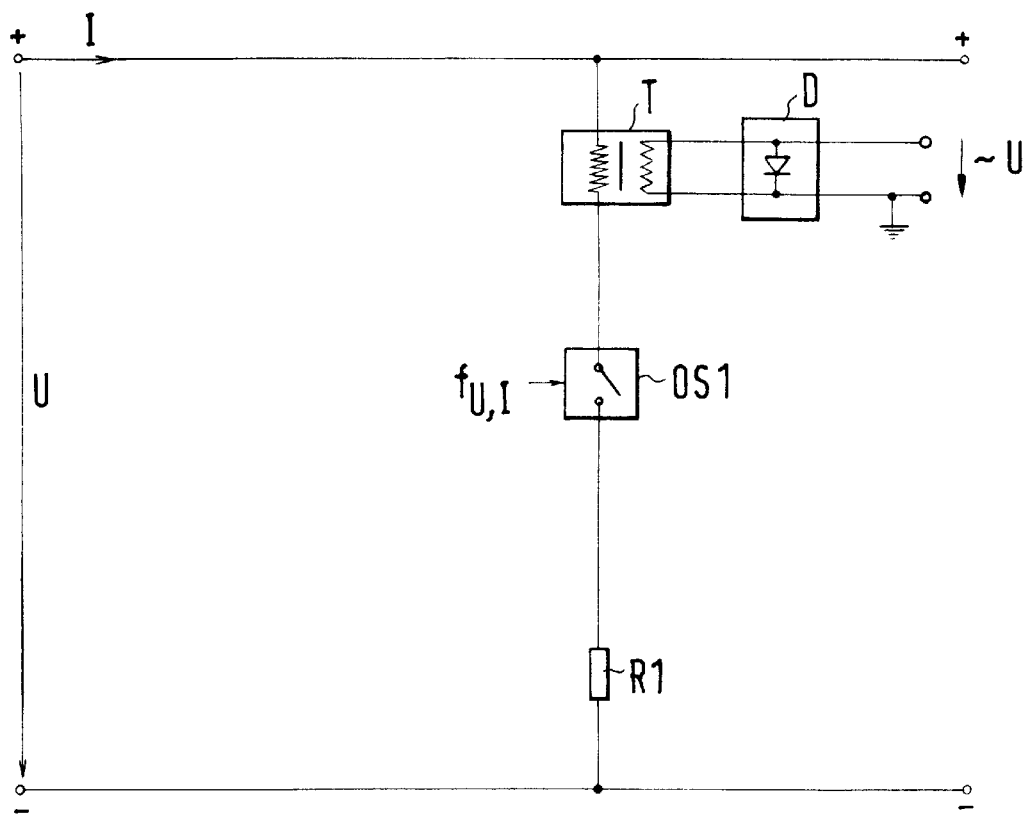
FIG. 1 is a block diagram of a simple embodiment of the circuit arrangement according to the invention for making isolated voltage measurements.

Referring to FIG. 1, there is shown a diagram of a circuit arrangement according to the invention for making isolated voltage measurements on a transmission line with a go conductor, denoted by "+" and a return conductor, denoted by "−". A shunt branch between the go conductor and the return conductor contains a series combination of a transformer T, a first optically controllable, clocked switching element OSI, and a first resistor R1, whose value may be chosen to be around 200 kΩ.

The voltage drop across the resistor R1, which is a measure of the potential difference U between the go conductor and the return conductor, is chopped with the clocked switching element OS1. The clocked switching element OS1 is preferably a photoMOS relay, particularly an optoelectronically driven MOSFET. It contains a light-emitting diode (LED) which is driven by a grounded clock generator (not shown) at a clock frequency $f_U$ around 1 kHz, for example. The LED, which is also at ground potential, sends clocked light signals to a photocell which switches an MOS transistor tied to the potential of the transmission line at the corresponding frequency. As a result, an alternating voltage proportional to the measured quantity, namely to the potential difference U between the go conductor and the return conductor, is induced in the secondary of the transformer T.

To be able to take off a (possibly pulsating) DC signal, a rectifier device D is provided at the secondary of the transformer T. In the simplest case, which is shown in FIG. 1, this rectifier device comprises a diode connected between the two secondary outputs of the transformer T.

Figure 3:
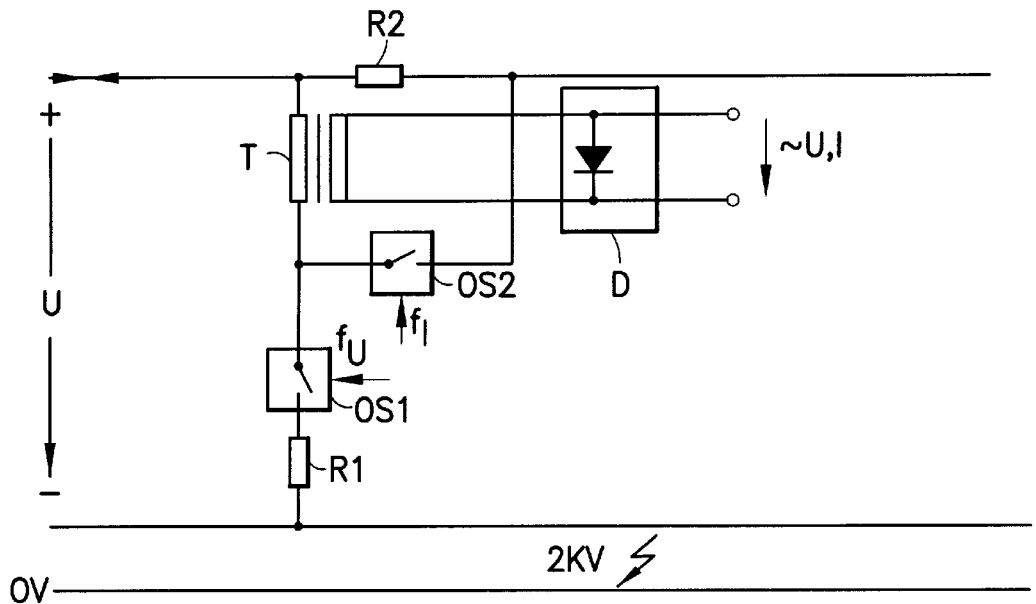
FIG. 3 shows an embodiment for making combined isolated voltage and current measurements.

In the particularly simple embodiment for making isolated current measurements shown in FIG. 3, the go conductor, denoted by "+", contains a second resistor R2 of the order of 100 Ω. Connected in parallel with the resistor R2 is a series combination of a transformer T, having an associated rectifier device D at the secondary like in FIG. 1, and a second optically controllable, clocked switching element OS2, which may function like the switching element OS1 described with reference to FIG. 1 and is operated at a clock frequency $f_I$. The supply current I through the resistor R2 is again measured by "chopping" the voltage drop across the resistor R2.

Figure 2:
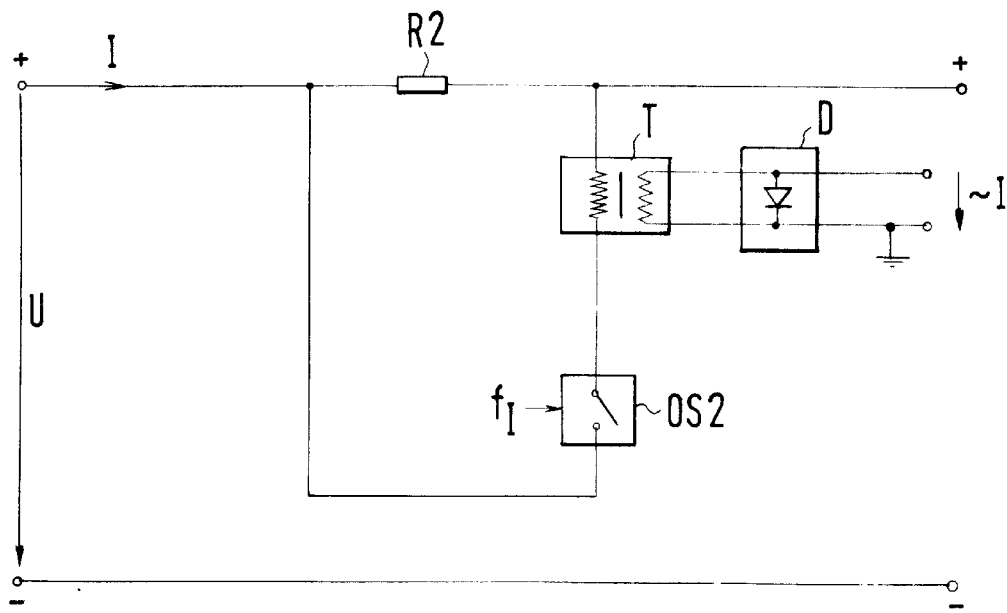
FIG. 2 shows a simple embodiment for making isolated current measurements.

A combined embodiment of the circuit arrangement according to the invention which can be used for both isolated voltage measurements and isolated current measurements is shown in FIG. 3. The components used correspond to those of FIGS. 1 and 2, with the same transformer T with associated rectifier device D being used both for voltage measurements and for current measurements. In the embodiment shown it is indicated that a potential difference of approximately 2 kV may exist between ground potential and a medium potential of the transmission line.

Figure 4:
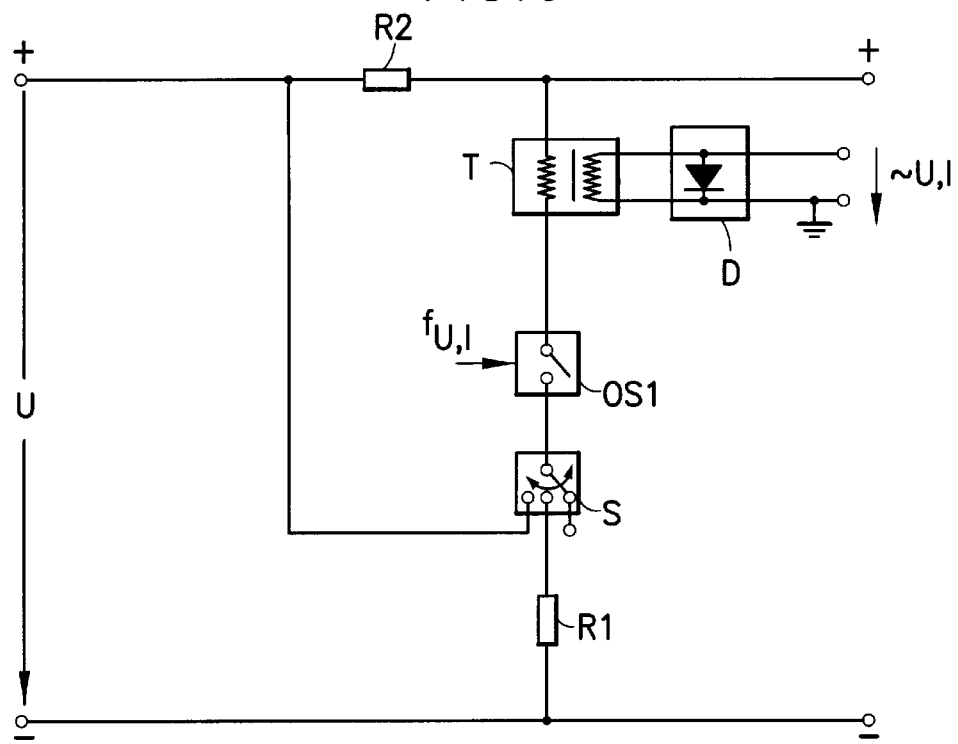
FIG. 4 shows an embodiment for making combined isolated voltage and current measurements with only one optically controllable, clocked switching element and a switch.

A further improved embodiment of the combined circuit arrangement according to the invention for making isolated voltage and current measurements is shown in FIG. 4. Instead of the second optically controllable, clocked switching element OS2 connected in parallel with the second resistor R2 in FIG. 3, a switch S is provided which can connect the end of the first switching element OS1 remote from the transformer to the end of the resistor R1 facing the transformer in a first switch position or to the end of the resistor R2 remote from the transformer in a second switch position. In a third switch position, which is shown in FIG. 4, the switch S disconnects the two resistors R1 and R2 from the end of the switching element OS1 remote from the transformer. In this position, neither a current measurement nor a voltage measurement is made, so that no shunt current flows between the go conductor and the return conductor.

Figure 5:
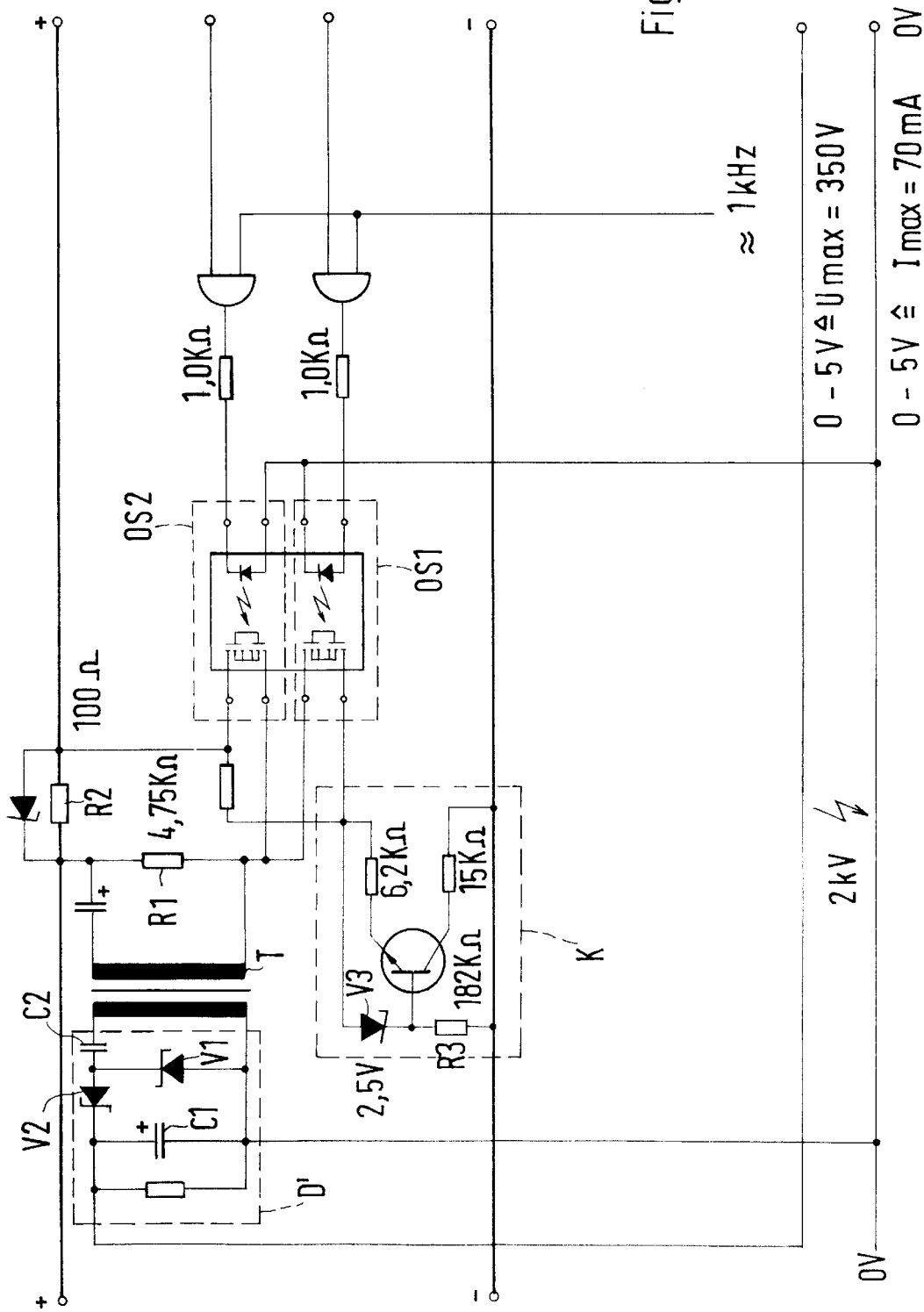
FIG. 5 is a circuit diagram of an embodiment for making combined isolated voltage and current measurements with a constant-current source at the primary of the transformer for linearizing the rectifier characteristic.

FIG. 5 shows an embodiment of a circuit arrangement according to the invention for making combined isolated voltage and current measurements in which a constant-current source K is provided at the primary of the transformer T for linearizing the characteristic of the rectifier device D' at the secondary.

In FIG. 5, concrete values of the electronic components shown are given, which, however, may be varied in other embodiments as required.

In the circuit arrangement of FIG. 5, the supply current through the resistor R2 is again measured by "chopping" the corresponding voltage drop. The resistor R1 also serves to limit the switching current to 1/50 of the rated current I (ripple of the supply current). The supply voltage U is "chopped" via a resistor R3 connected in series with resistor R1. Because of the ripple of the supply current, on an average, a current on the order of 1 mA is switched.

Isolation of the chopped voltage is provided via the transformer T, which is followed by a voltage doubler consisting of capacitors C1, C2, Schottky diodes V1, V2, and a resistor.

Since the indicating range for a voltage measurement is greater than that for a current measurement (20 V to 350 V as compared with 30 mA to 70 mA), the threshold voltage of the rectifier diodes causes a nonlinearity in the indicating range. The constant-current source K counteracts this. With decreasing supply voltage, part of the "chopped" current remains constant, thus compensating the diode characteristics. Voltages can thus be measured to an accuracy within approximately 20 V.

What is claimed is:

1. A circuit arrangement for making isolated measurements on a current of a transmission line with a go conductor and a return conductor for supplying power to electrical apparatus, wherein the go conductor contains a-first resistor (R2) connected in series therewith for producing a voltage drop across the first resistor which is shunted by a series combination of a transformer (T) having a primary winding and a secondary winding and a first optically controllable clocked switching element (OS2) for chopping the voltage across the first resistor and providing the chopped voltage to the primary winding of the transformer (T), and wherein said isolated measurements are made by measuring an isolated voltage on the secondary winding of the transformer (T), and wherein said circuit arrangement also allows for making isolated measurements on a voltage of the transmission line characterized in that said circuit arrangement further comprises a shunt branch between the go conductor (+) and the return conductor (−) containing a series combination of the transformer (T), a second optically controllable, clocked switching element (OS1) for chopping the line voltage and providing the chopped line voltage to the primary winding of the transformer (T), and a second resistor (R1) connected in series with the shunt branch for limiting a current drawn through the shunt branch.

2. A circuit arrangement for making isolated measurements on a current of a transmission line with a go conductor and a return conductor for supplying power to electrical apparatus, wherein the go conductor contains a resistor (R2) connected in series therewith for producing a voltage drop across the resistor, which is shunted by a series combination of a transformer (T) having a primary winding and a secondary winding and an optically controllable, clocked switching element (OS2) for chopping the voltage across the resistor and providing the chopped voltage to the primary winding of the transformer (T), wherein the isolated measurements are made by measuring an isolated voltage on the secondary winding of the transformer (T), wherein the secondary winding of the transformer (T) has two outputs, characterized in that a rectifier device (D) is provided between the outputs of the secondary winding of the transformer (T), characterized in that at the primary winding of the transformer (T), a constant-current source (K) is provided at the primary winding of the transformer (T) for linearizing the rectifier device (D) at the secondary winding of the transformer (T).

3. A circuit arrangement for making isolated measurements of a current or a voltage of a transmission line with a go conductor and a return conductor for supplying power to electrical apparatus, wherein said circuit arrangement has a switch (S) including a first switch position for making current measurements and a second switch position for making voltage measurements, wherein the go conductor or the return conductor contains a first resistor (R2) connected in series therewith for producing a voltage drop across the first resistor (R2), wherein the first resistor (R2) is shunted by a series combination of a transformer (T) having a primary winding and a secondary winding, an optically controlled, clocked switching element (OS1), and the switch (S) operated at the first switch position so as to allow the switching element to chop the voltage across the first resistor (R2) and provide the chopped voltage to the primary winding of the transformer, and wherein said circuit arrangement further comprises a second resistor (R1) being connected in series with the series combination of the transformer for limiting a current drawn through said series combination, the clocked switching element (OS1) and the switch (S) operated at the second switch position so as to allow the switching element (OS1) to chop the line voltage and provide the chopped line voltage to the primary winding of the transformer, and wherein the measurements are made by measuring an isolated voltage at the secondary winding of the transformer.

4. A circuit arrangement as claimed in claim 3, wherein the switch (S) further includes a third switch position for disconnecting the switching element (OS1) from both the first resistor (R2) and the second resistor (R1).

5. A circuit arrangement as claimed in claim 3, characterized in that the clocked switching element (OS1) is a photoMOS relay, particularly optoelectronically driven MOSFET, and the photoMOS relay contains a light emitting diode (LED) driven by a grounded clock generator for effecting the chopping of the voltage across the first resistor (R2) or the line voltage.

6. A circuit arrangement as claimed in claim 1, characterized in that for the voltage measurement and for the current measurement, the same transformer (T) is provided.

7. A circuit arrangement for making isolated measurements of a voltage of a transmission line with a go conductor and a return conductor for supplying power to electrical apparatus, wherein a shunt branch between the go conductor (+) and the return conductor (−) contains a series combination of a transformer (T), an optically controlled, clocked switching element (OS1) and a resistor for limiting a current drawn through the shunt branch, wherein the transformer (T) has a primary winding and a secondary winding, the secondary winding isolated from the go conductor (+) and the return conductor (−), the secondary winding having direct measurement terminals for making isolated measurements of a voltage representative of the voltage across the go conductor (+) and the return conductor (−), and the optically controlled, clocked switching element (OS1) is used for chopping the voltage and providing the chopped voltage to the primary winding of the transformer (T), wherein said isolated measurements are made by measuring an isolated voltage across the direct measurement terminals, and wherein the secondary winding of the transformer (T) has two outputs, characterized in that a rectifier device (D') is provided between the outputs of the secondary winding of the transformer (T) and a constant-current source (K) is provided at the primary winding of the transformer (T) for linearizing the rectifier device (D') at the secondary winding of the transformer (T).

* * * * *

UNITED STATES PATENT AND TRADEMARK OFFICE
CERTIFICATE OF CORRECTION

PATENT NO. : 6,184,725 B1
DATED : February 6, 2001
INVENTOR(S) : Mohr

It is certified that error appears in the above-identified patent and that said Letters Patent is hereby corrected as shown below:

<u>Column 5,</u>
Line 45, "-" should be deleted

Signed and Sealed this

Seventh Day of August, 2001

*Attest:*

*Attesting Officer*

NICHOLAS P. GODICI
*Acting Director of the United States Patent and Trademark Office*